(12) United States Patent
Toyoda et al.

(10) Patent No.: US 7,268,191 B2
(45) Date of Patent: Sep. 11, 2007

(54) METHOD FOR PRODUCING EPOXY RESIN COMPOSITION FOR SEMICONDUCTOR ENCAPSULATION AND EPOXY RESIN COMPOSITION FOR SEMICONDUCTOR ENCAPSULATION AND SEMICONDUCTOR DEVICE OBTAINED THEREBY

(75) Inventors: Eiji Toyoda, Ibaraki (JP); Takeshi Okada, Ibaraki (JP); Keisuke Yoshikawa, Ibaraki (JP); Takuya Eto, Ibaraki (JP); Kazuhiro Ikemura, Ibaraki (JP); Shinya Akizuki, Ibaraki (JP); Tsuyoshi Ishizaka, Ibaraki (JP); Takahiro Uchida, Ibaraki (JP); Kei Toyota, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 462 days.

(21) Appl. No.: 11/000,905

(22) Filed: Dec. 2, 2004

(65) Prior Publication Data

US 2005/0154152 A1 Jul. 14, 2005

(30) Foreign Application Priority Data

Dec. 4, 2003 (JP) ............... P. 2003-406213

(51) Int. Cl.
*C08L 63/00* (2006.01)
*C08L 63/02* (2006.01)
*C08L 63/04* (2006.01)
*H01L 23/29* (2006.01)

(52) U.S. Cl. ............ 525/507; 257/793; 523/466; 525/481

(58) Field of Classification Search ............ None
See application file for complete search history.

(56) References Cited

U.S. PATENT DOCUMENTS

| 6,235,865 B1 * | 5/2001 | Shimizu et al. ............ 528/89 |
| 6,274,251 B1 | 8/2001 | Ohashi et al. |
| 6,525,160 B1 * | 2/2003 | Goda et al. ............ 528/29 |
| 6,767,980 B2 * | 7/2004 | Yurugi et al. ............ 526/320 |

FOREIGN PATENT DOCUMENTS

| JP | 56-45491 B2 | | 10/1981 |
| JP | 5-275572 A | * | 10/1993 |
| JP | 6-228280 A | * | 8/1994 |
| JP | 7-35432 B2 | | 4/1995 |
| JP | 7-122683 A | | 5/1995 |
| JP | 9-52228 A | | 2/1997 |
| JP | 9-216936 A | * | 8/1997 |

* cited by examiner

Primary Examiner—Robert Sellers
(74) Attorney, Agent, or Firm—Sughrue Mion Pllc.

(57) ABSTRACT

A method for producing an epoxy resin composition for semiconductor encapsulation, which does not cause void generation and the like and is excellent in reliability. A method for producing an epoxy resin composition for semiconductor encapsulation, which contains the following components (A) to (C): (A) an epoxy resin, (B) a phenol resin, and (C) a hardening accelerator, which comprises mixing the whole or a part of the components excluding the component (A) among the components containing the components (A) to (C) in advance under a reduced pressure of from 1.333 to 66.65 kPa and under a heating condition of from 100 to 230° C., and then mixing the component (A) and remaining components with the resulting mixture.

2 Claims, 1 Drawing Sheet

METHOD FOR PRODUCING EPOXY RESIN COMPOSITION FOR SEMICONDUCTOR ENCAPSULATION AND EPOXY RESIN COMPOSITION FOR SEMICONDUCTOR ENCAPSULATION AND SEMICONDUCTOR DEVICE OBTAINED THEREBY

FIELD OF THE INVENTION

This invention relates to a method for producing an epoxy resin composition for semiconductor encapsulation, which is excellent in moldability and reliability and to an epoxy resin composition for semiconductor encapsulation and a semiconductor device obtained thereby.

BACKGROUND OF THE INVENTION

Conventionally, transistor, IC, LSI and the like semiconductor elements are manufactured as semiconductor devices by encapsulating them with plastic packages, e.g., using an epoxy resin compositions, from the viewpoint of protecting them from the external environment and enabling handling of the elements. Such an epoxy resin composition is obtained, for example, by mixing and kneading an epoxy resin, a phenol resin, a hardening accelerator, and other components such as a silane coupling agent and the like, using a mixing roller, a mixing pot, a kneader or the like. In order to improve dispersibility and wettability of respective components, a production method is employed in which certain parts of the components are pre-mixed in advance and then the remaining parts of the components are mixed with the resulting mixture.

As an example of such a production method, it has been proposed to prepare and use an epoxy resin hardener by mixing a novolak-type phenol resin hardener with tetraphenylphosphonium tetraphenylborate under heating (cf. Reference 1). The epoxy resin composition obtained by the above production method exerts an effect that the epoxy resin composition has good storage stability and the cured product has excellent moisture resistance.

On the other hand, a method has been proposed in which a part or entire portion of a phenol resin component is melt-mixed with an epoxy silane coupling agent and an amine hardening accelerator, and then this is melt-mixed with the remaining components (cf. Reference 2).

Reference 1: JP-B-56-45491

Reference 2: JP-B-7-35432

SUMMARY OF THE INVENTION

However, the epoxy resin compositions obtained by these production methods have problems such as generation of voids, because volatile components existing or generating in the system at the time of preliminary mixing are also remained in the finally obtained epoxy resin composition for semiconductor encapsulation, and it was difficult to obtain a cured product which does not cause such a problem.

The invention has been made by taking such circumstances into consideration, and an object thereof is to provide a method for producing an epoxy resin composition for semiconductor encapsulation, which does not cause void generation and the like and is excellent in reliability, and to provide an epoxy resin composition for semiconductor encapsulation and a semiconductor device obtained thereby.

In order to achieve the above object, the present invention provides:

(1) a method for producing an epoxy resin composition for semiconductor encapsulation, which contains the following components (A) to (C):

(A) an epoxy resin, (B) a phenol resin, and (C) a hardening accelerator, which comprises mixing the whole or a part of the components excluding the component (A) among the components containing the components (A) to (C) in advance under a reduced pressure of from 1.333 to 66.65 kPa and under a heating condition of from 100 to 230° C., and then mixing the component (A) and remaining components with the resulting mixture;

(2) the method for producing an epoxy resin composition for semiconductor encapsulation according to (1) above, wherein the hardening accelerator as the aforementioned component (C) is a tetra-substituted phosphonium tetra-substituted-borate;

(3) an epoxy resin composition for semiconductor encapsulation which is obtainable by the method for producing an epoxy resin composition for semiconductor encapsulation according to (1) or (2) above; and (4) a semiconductor device comprising a semiconductor element and the epoxy resin composition for semiconductor encapsulation according to (3) above which seals the semiconductor element.

That is, the present inventors have conducted extensive studies with the aim of obtaining an epoxy resin composition which can control various problems such as generation of voids that are formed in making a semiconductor device using the epoxy resin composition and can be used as an encapsulating material having excellent moldability. Thus, studies were continued with changing a viewpoint from the conventional examination on the components themselves to means for solution. As a result, it was found that a phenol resin conventionally used as a hardener, a hardening accelerator and a silane coupling agent, as a component of an epoxy resin composition, are degraded during mixing to form a so-called volatile component as a reaction product, and this becomes the factor of the aforementioned problem. As a result of further studies based on this fact, it was found that, when the entire portion or a part of components excluding the epoxy resin are preliminary mixed under the reduced-pressure and heating conditions within specified ranges in preparing an epoxy resin composition, and then the epoxy resin composition is prepared via a step of mixing the aforementioned epoxy resin and remaining components with the resulting mixture, the aforementioned volatile components are removed under these conditions and, as a result, the aforementioned semiconductor device having high reliability can be obtained based on the inhibition of the defects during molding. Thus, the present invention was accomplished.

BRIEF DESCRIPTION OF THE DRAWINGS

By way of example and to make the description more clear, reference is made to the accompanying drawing in which.

DETAILED DESCRIPTION OF THE INVENTION

Figure 1:
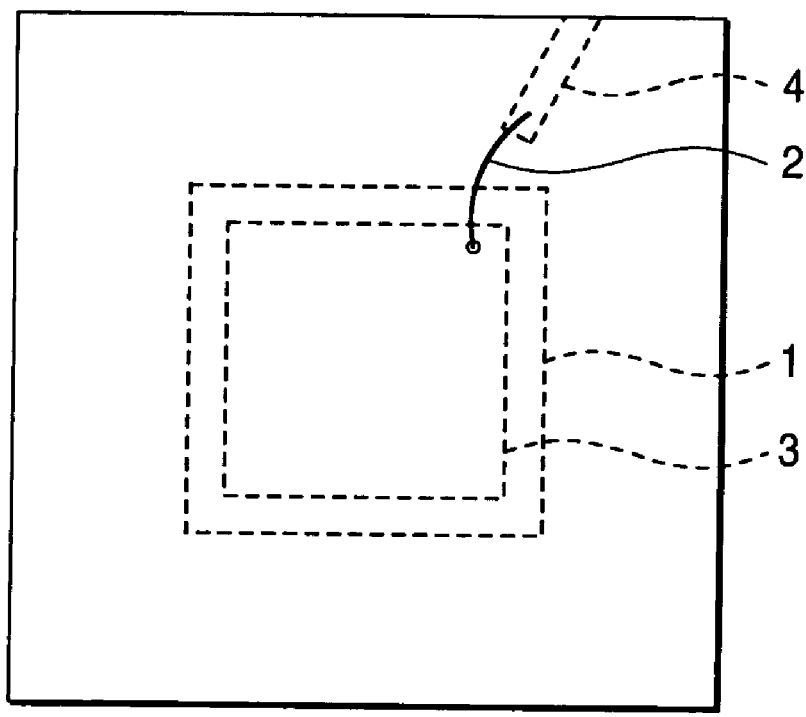
FIG. 1 is a plane view showing a package used for the measurement of metal wire flow quantity of a semiconductor device.

As described above, an epoxy resin composition for semiconductor encapsulation is produced in the present invention by preliminarily mixing the entire portion or a part of the components excluding an epoxy resin (component (A)) under the reduced-pressure and heating conditions within specified ranges, and then mixing the aforementioned epoxy resin (component (A)) and remaining components with this mixture. Accordingly, the volatile components are removed from the resulting epoxy resin composition for semiconductor encapsulation at the time of the preliminary mixing under the aforementioned conditions. When this composition is used as a resin composition for encapsulation, a semiconductor device having high reliability is obtained in which generation of voids and the like are controlled during package molding.

In addition, when a tetra-substituted phosphonium tetra-substituted borate is used as the hardening accelerator, hardenability and reliability of molded products are further improved.

The epoxy resin composition for semiconductor encapsulation of the present invention is obtained using an epoxy resin (component A), a phenol resin (component B) and a hardening accelerator (component C) and is generally in a powder form or a tablet shape made of the same.

The aforementioned epoxy resin (component A) is not particularly limited and various epoxy resins can be used. For example, a phenol novolak type epoxy resin, a cresol novolak type epoxy resin, a biphenyl type epoxy resin, a triphenylmethane type epoxy resin and the like may be used. The epoxy resin may be used alone or as a combination of two or more. Among these epoxy resins, it is preferable to use a biphenyl-type epoxy resin or a low moisture absorption-type epoxy resin in which one or more lower alkyl group(s) are added to the phenyl ring. As such epoxy resins, those having an epoxy equivalent of from 150 to 250 and a softening point of from 50 to 130° C. are preferable.

The phenol resin (component B) to be used together with the aforementioned epoxy resin (component A) functions as a hardener of the aforementioned epoxy resin (component A) and is not particularly limited. Examples include phenol novolak, cresol novolak, a biphenyl-type novolak, a triphenylmethane-type, naphthol novolak, a phenol aralkyl resin and the like. The phenol resin may be used alone or as a combination of two or more. Among them, it is preferable to use a compound having low hygroscopicity such as a phenol aralkyl resin.

With respect to the ratio of the aforementioned epoxy resin (component A) and phenol resin (component B), it is preferable to mix them in such a ratio that hydroxyl group equivalent in the phenol resin becomes from 0.5 to 2.0 equivalents per 1 epoxy group equivalent in the epoxy resin. It is preferably from 0.8 to 1.2 equivalents.

The hardening accelerator (component C) to be used together with the aforementioned epoxy resin (component A) and the phenol resin (component B) is not particularly limited with the proviso that it accelerates the reaction of epoxy group with hydroxyl group. Conventionally known compounds, such as triphenylphosphine and the like tertiary phosphorus compounds, tetraphenylphosphonium tetraphenylborate (to be referred to as "TPP-K" hereinafter), tetraphenylphosphonium tetrakis(4-methylphenyl)borate (to be referred to as "TPP-MK" hereinafter) and the like quaternary phosphonium compounds, 1,8-diazabicyclo(5,4,0)undecane-7 and the like diazabicycloalkene compounds, triethylenediamine and the like tertiary amines and 2-methylimidazole and the like imidazoles, are used which can be used alone or as a mixture of two or more. Among them, TPP-K and the like phosphonium salt hardening accelerators are preferably used from the viewpoint of hardenability and reliability of the product.

It is preferable to set the ratio of the aforementioned hardening accelerator (compound C) to a range of from 1 to 20 parts by weight (to be referred to as "part(s)" hereinafter) based on 100 parts of the aforementioned phenol resin (component B). It is more preferably from 2 to 10 parts. The intended hardening reaction of the aforementioned epoxy resin (component A) with the phenol resin (component B) may not progress when the ratio is less than 1 part, and the reaction rate may become too fast when it exceeds 20 parts thus showing a tendency in that the reaction progresses during the epoxy resin composition production process or the storage stability as an encapsulating material may become poor.

In general, a silane coupling agent is used as an optional component together with the aforementioned components A to C. As the silane coupling agent, various coupling agents can be used without particular limitation, and an agent having two or more alkoxy groups is preferably used. The illustrative examples thereof include β-(3,4-epoxycyclohexyl)ethyltrimethoxysilane, γ-glycidoxypropyltrimethoxysilane, γ-mercaptopropyltrimethoxysilane, γ-(2-aminoethyl)aminopropyltrimethoxysilane, γ-mercaptopropyldimethoxysilane, γ-anilinopropyltrimethoxysilane, hexamethyldisilazane and the like. The silane coupling agent may be used alone or as a mixture of two or more.

It is preferable to set the amount of the silane coupling agent to a range of from 0.1 to 2% by weight based on the entire epoxy resin composition. It is more preferably from 0.3 to 1.5% by weight. There is a possibility of causing a problem of reducing strength of the cured product when the amount is less than 0.1% by weight, and there is a tendency of causing a problem of reducing modulus of elasticity of the cured product when the amount exceeds 2% by weight.

In addition, an inorganic filler is generally used as a component together with the aforementioned components A to C. As the aforementioned inorganic filler, various conventionally known fillers may be used without particular limitation. For example, molten silica powder, crystalline silica powder and the like silica powders, alumina powder and the like are used. These inorganic fillers can be used in any of the pulverized, spherical, grinding treated and the like shapes. Particularly, it is preferable to use a spherical molten silica powder. The inorganic filler may be used alone or as a mixture of two or more. Also, it is preferable to use the inorganic filler having an average particle size of within the range of from 5 to 40 μm, from the viewpoint that the fluidity can be improved. Regarding the measurement of the average particle size, it is preferable to measure it by a laser diffraction scattering particle size distribution analyzer.

It is preferably to set the amount of the aforementioned inorganic filler within a range of from 80 to 92% by weight, particularly desirably from 87 to 92% by weight, based on the epoxy resin composition. There is a tendency in that amount of water absorption of the package after molding may increase and reliability after the packaging is reduced when the amount of the inorganic filler is less than 80% by weight. Also, there is a tendency that the viscosity becomes high and the fluidity therefore becomes poor when it exceeds 92% by weight.

In this connection, according to the epoxy resin composition for semiconductor encapsulation of the present invention, other additives such as a flame retarder, a flame retardancy assisting agent, a mold release agent, carbon black or the like pigment or colorant, a stress reducing agent, a tackifier and the like can optionally be mixed as occasion demands, in addition to the aforementioned components A to C.

As the aforementioned flame retarder, a novolak-type brominated epoxy resin and the like can be exemplified, and diantimony trioxide, diantimony pentoxide or the like is used as the flame retardancy assisting agent. These may be used alone or as a mixture of two or more.

As the aforementioned mold release agent, a higher fatty acid, a higher fatty acid ester, a higher fatty acid calcium salt and the like compounds can be exemplified and, for example, carnauba wax and polyethylene waxes may be used. These are used alone or as a mixture of two or more.

Also, examples of the aforementioned stress reducing agent include a methyl acrylate-butadiene-styrene copolymer, a methyl methacrylate-butadiene-styrene copolymer and the like butadiene system rubbers and a silicone compound. In addition, a hydrotalcite compound, bismuth hydroxide or the like ion trapping agent may be mixed for the purpose of improving reliability in a moisture resistance reliability test.

The epoxy resin composition for semiconductor encapsulation of the present invention can be produced, for example, in the following manner. Firstly, the entire portion or a part of the components excluding the epoxy resin (component A) are mixed in advance in a mixing pot with heating under atmospheric pressure, and then a preliminary mixture is prepared by thoroughly pre-mixing them under a reduced pressure condition. Next, the epoxy resin (component A) and the remaining components are mixed with this preliminary mixture, thoroughly mixed using a mixer or the like under atmospheric pressure and then, similar to the above, melt-kneaded using a mixing roller, a mixing pot, a kneader or the like. After cooling this to room temperature, the epoxy resin composition for semiconductor encapsulation can be produced via a series of steps of pulverizing by employing a conventionally known means and making it into tablets as occasion demands.

The mixing apparatus to be used for the aforementioned preliminary mixing under a reduced pressure condition is not particularly limited with the proviso that it is a mixing pot equipped with a pressure reducing mechanism, and a vacuum mixing pot or the like is used.

Regarding the aforementioned reduced pressure condition for the preliminary mixing, it is necessary to set it within the range of from 1.333 to 66.65 kPa, particularly preferably from 4 to 40 kPa. It may be difficult to remove the volatile components under an atmosphere of exceeding 66.65 kPa. When it is a reduced pressure condition of less than 1.333 kPa, it may be difficult to ensure mass productivity from the facility point of view, and necessary components may be evaporated, thereby exerting a bad influence upon the resin characteristics.

As the heating temperature condition at the time of the preliminary mixing under the aforementioned reduced pressure condition, it is necessary to set it within the range of from 100 to 230° C., more preferably from 130 to 200° C., for the purpose of efficiently evaporating the volatile component. It may be difficult to perform uniform stirring of the components and removal of the volatile component when it is less than 100° C., and when it exceeds 230° C., there may be a problem of possibility of reaction and degradation of the components.

In addition, the period of time for the preliminary mixing under a reduced pressure condition is not particularly limited, and it is carried out generally within the range of from 30 minutes to 2 hours.

Though the volatile component to be removed by the aforementioned preliminary mixing under a reduced pressure condition is not particularly limited, and its examples include aromatic compounds which are considered to be degradation and reaction products of the phenol compound (component B) and hardening accelerator (component C) and alcohols and the like which are considered to be degradation products of the silane coupling agent as the optional component. When the epoxy resin composition in which such volatile components are remained is used as an encapsulating material, it becomes a factor of generating a problem such as generation of voids during production of a semiconductor device.

Encapsulation of a semiconductor element using the epoxy resin composition for semiconductor encapsulation is not particularly limited and can be carried out by the conventionally known molding method such as a usual transfer molding and the like.

Next, Examples and Comparative examples are described below.

EXAMPLE 1

Using a vacuum mixing pot, 56 parts of phenol novolak resin (hydroxyl group equivalent 110, softening point 75° C.), 3 parts of tetraphenylphosphonium tetraphenylborate and 0.6 part of an epoxy silane coupling agent (γ-glycidoxypropyltrimethoxysilane) were mixed at 170° C. for 1 hour under atmospheric pressure, and then mixed under the same temperature condition for 30 minutes under a reduced pressure condition of 20 kPa. Thereafter, a preliminary mixture was prepared by returning the atmosphere to atmospheric pressure and adding 2.5 parts of carnauba wax.

Subsequently, total amount of the aforementioned preliminary mixture, 100 parts of a biphenyl type epoxy resin (epoxy equivalent 195, melting point 107° C.), 1,200 parts of molten silica powder (average particle size 30 μm), 18 parts of diantimony trioxide, 6 parts of carbon black and 3 part of an epoxy silane coupling agent (3-mercaptopropyltrimethoxysilane) were kneaded at 100° C. for 2 minutes and then cooled and pulverized, thereby preparing the epoxy resin composition for semiconductor encapsulation of interest.

EXAMPLES 2 TO 8 AND COMPARATIVE EXAMPLES 1 and 2

Respective epoxy resin compositions for semiconductor encapsulation were prepared in the same manner as in Example 1 except that, in preparing respective preliminary mixtures, the reduced pressure condition, temperature condition and pressure reducing period were changed to the set conditions showing the following Table 1 and Table 2.

TABLE 1

| Preliminary mixing conditions | Examples | | | | | | | |
|---|---|---|---|---|---|---|---|---|
| | 1 | 2 | 3 | 4 | 5 | 6 | 7 | 8 |
| Reduced pressure condition (kPa) | 20 | 40 | 13.3 | 13.3 | 60 | 1.4 | 20 | 20 |
| Temperature condition (° C.) | 170 | 170 | 150 | 200 | 190 | 170 | 100 | 230 |
| Reduced Pressure period (hr) | 0.5 | 0.5 | 1 | 0.5 | 1 | 0.5 | 0.5 | 0.5 |

TABLE 2

| | Comparative Examples | |
|---|---|---|
| Preliminary mixing conditions | 1 | 2 |
| Reduced pressure condition (kPa) | 80 | 20 |
| Temperature condition (° C.) | 190 | 90 |
| Reduced Pressure period (hr) | 1 | 1 |

Using the powdery epoxy resin compositions thus obtained in the Examples and Comparative Examples, semiconductor devices were produced in the following manner. That is, each of the aforementioned powdery epoxy resin compositions was made into tablets, and a semiconductor device was produced by mold-forming an semiconductor element through a transfer molding (molding condition: after hardening at 175° C. ×90 seconds+175° C.×5 hours) using an automatic molding machine (CPS-40L) manufactured by TOWA. This semiconductor device a 114 pin four-way flat package (LQFP-144, size: 20 mm×20 mm×thickness 1.4 mm). Using the semiconductor devices obtained in this manner, metal wire flow and the number of void generation were measured and evaluated.

Figure 2:
FIG. 2 is a schematic illustration showing the method for measuring metal wire flow quantity of a semiconductor device.

Metal Wire Flow:

The LQFP-144 (size: 20 mm×20 mm×thickness 1.4 mm) stringed with a metal wire (wire diameter 23 μm, wire length 6 mm) was produced in the aforementioned manner. At the time of preparing the aforementioned semiconductor device, a metal wire 2 was stringed on the package frame of LQFP having a die pad 1 as shown in FIG. 1, and a semiconductor device (package) was prepared using this as described in the foregoing. In FIG. 1, 3 is a semiconductor chip and 4 is a lead pin. Using the thus prepared package, metal wire flow quantity was measured by a soft X-ray analyzer. Regarding the measurement, flow quantity of the metal wire 2 from the front direction was measured as shown in FIG. 2 by selecting and measuring 10 metal wires from each package. Thereafter, metal wire flow rate [(d/L)×100] was calculated by defining a value corresponding to the maximum portion of the flow quantity of the metal wire 2 as the value of metal wire flow (dmm) of the package. In this connection, L represents a distance (mm) between the metal wire 2. Also, a case in which the aforementioned metal wire flow rate was 6% or more was expressed as XX, and a case of less than 6% as OO.

The Number of Void Generation:

The packages (LQFP-144) prepared in the above were observed using the soft X-ray analyzer to count voids of 0.2 mm in diameter or more, and the number of packages in which voids were generated was shown. In this case, 10 packages were prepared for each of the Examples and Comparative Examples.

TABLE 3

| | Examples | | | | | | | |
|---|---|---|---|---|---|---|---|---|
| | 1 | 2 | 3 | 4 | 5 | 6 | 7 | 8 |
| Metal wire flow | OO | OO | OO | OO | OO | OO | OO | OO |
| The number of void generation | 0 | 0 | 0 | 0 | 1 | 0 | 2 | 0 |

TABLE 4

| | Comparative Examples | |
|---|---|---|
| | 1 | 2 |
| Metal wire flow | XX | XX |
| The number of void generation | 10 | 7 |

Based on the above results, the products of Examples prepared using the epoxy resin compositions, obtained by preliminary mixing the components excluding the epoxy resin under the aforementioned specified ranges of reduced-pressure and heating conditions and then mixing this preliminary mixture with the remaining components, generated no voids or only a little voids and showed a good result regarding the metal wire flow. On the contrary, the product of Comparative Example 1 obtained using the epoxy resin composition, prepared under a reduced pressure condition of exceeding 66.65 kPa at the time of preliminary mixing, generated malfunction regarding the metal wire flow and was poor in reliability because generation of voids was confirmed. Also, similar to the aforementioned product of Comparative Example 1, the product of Comparative Example 2 obtained using the epoxy resin composition, prepared under a heating temperature condition of less than 100° C. at the time of preliminary mixing, also generated malfunction regarding the metal wire flow and was poor in reliability because generation of voids was confirmed.

While the invention has been described in detail and with reference to specific embodiments thereof, it will be apparent to one skilled in the art that various changes and modifications can be made therein without departing from the scope thereof.

This application is based on Japanese patent application No. 2003-406213 filed Dec. 4, 2004, the entire contents thereof being hereby incorporated by reference.

What is claimed is:

1. A method for producing an epoxy resin composition for semiconductor encapsulation, which contains the following components (A) to (C):
(A) an epoxy resin,
(B) a phenol resin, and
(C) a hardening accelerator,
which comprises mixing the whole or a part of the components excluding the component (A) among the components containing the components (A) to (C) in advance under a reduced pressure of from 1.333 to 66.65 kPa and under a heating condition of from 100 to 230° C., and then mixing the component (A) and remaining components with the resulting mixture.

2. The method for producing an epoxy resin composition for semiconductor encapsulation according to claim 1, wherein the hardening accelerator as the aforementioned component (C) is a tetra-substituted phosphonium tetra-substituted borate.

* * * * *